United States Patent [19]

Dey et al.

[11] Patent Number: 5,513,118
[45] Date of Patent: Apr. 30, 1996

[54] HIGH LEVEL SYNTHESIS FOR PARTIAL SCAN TESTING

[75] Inventors: Sujit Dey; Miodrag Potkonjak; Rabindra K. Roy, all of Plainsboro, N.J.

[73] Assignee: NEC USA, Inc., Princeton, N.J.

[21] Appl. No.: 113,056

[22] Filed: Aug. 25, 1993

[51] Int. Cl.⁶ .................................................. G06F 17/50
[52] U.S. Cl. ........................ 364/490; 364/488; 364/489; 364/578; 371/22.3
[58] Field of Search ................................. 364/488–491, 364/578; 371/22.1, 22.3, 23

[56] References Cited

U.S. PATENT DOCUMENTS

| 5,043,986 | 8/1991 | Agrawal et al. | 371/25.1 |
|---|---|---|---|
| 5,084,876 | 1/1992 | Welham et al. | 371/23 |
| 5,305,328 | 4/1994 | Motohara et al. | 371/27 |
| 5,319,647 | 6/1994 | Hosokawa et al. | 371/27 |
| 5,329,471 | 7/1994 | Swoboda et al. | 364/578 |

OTHER PUBLICATIONS

Stok, "False Loops through Resource Sharing," *1992 Int'l Conference on Computer–Aided Design*, pp. 345–348.
Papachristou et al., "SYNTEST: a method for high–level SYNthesis with self–TESTability," *1991 Int'l Conference on Computer Design*, pp. 458–462.
Dey et al., "Synthesizing Designs with Low–Cardinality Minimum Feedback Vertex Set for Partial Scan Application," *Proceedings 12th IEEE VLSI Test Symposium, Apr. 1994*, pp. 2–7.
Chu et al., "HYPER: An Interactive Synthesis Environment for High Performance Real Time Applications," *1989 Int'l Conference on Computer Design*, pp. 432–435.
Cheng et al., "A Partial Scan Method for Sequential Circuits with Feedback," *IEEE Transactions on Computers*, vol. 39, No. 4, Apr. 1990, pp. 544–548.
Cheng et al., "An Economical Scan Design for Sequential Logic Test Generation," *1989 Int'l Symposium on Fault–Tolerant Computing*, pp. 28–35.
Agrawal et al., "Designing Circuits with Partial Scan," *IEEE Design & Test of Computers Apr. 1988*, pp. 8–15.
Michael E. McFarland et al, "The High–Level Synthesis of Digital Systems" Feb. 1990, Proceedings of the IEEE. vol. 78, No. 2 pp. 301–318.
Tien–Chien Lee et al, "Behaviorial Synthesis for Easy Testability in Data Path Scheduling", Proc. of the Int'l Conf. on Computer–Aided Design, 1992, pp. 616–619.
Ashutosh Mujumdar et al, "Incorporating Testability Considerations in High–Level Synthesis" FTCS 1992, pp. 272–279.
Tien–Chien Lee et al, "Behaviorial Synthesis of Highly Testable Data Paths under the Non–Scan and Partial Scan Environments", 1993, 30th ACM/IEEE Design Automation Conference, pp. 292–297.
J. M. Rabaey etal, "Fast Prototyping of Datapth–Intensive Architectures" 1991, IEEE Design & Test of Computers, pp. 40–51.

(List continued on next page.)

*Primary Examiner*—Kevin J. Teska
*Assistant Examiner*—Leigh Marie Garbowski
*Attorney, Agent, or Firm*—Philip J. Feig

[57] ABSTRACT

A method for performing high level synthesis of integrated circuits simultaneously considers testability and resource utilization. The method considers the relationship between hardware sharing, loops in the synthesized data path, and partial scan testing overhead. Hardware sharing is used to minimize the quantity of scan registers required to synthesize data paths with a minimal quantity of loops. A random walk based algorithm is used to break all control data flow graph (CDFG) loops with a minimal quantity of scan registers. Subsequent scheduling and assignment avoids the formation of loops in the data path by reusing the scan registers, while ensuring high resource utilization of the components of hardware costs: execution units, registers and interconnects. The partial scan overhead incurred is less than that of conventional gate level design partial scan techniques.

4 Claims, 7 Drawing Sheets

OTHER PUBLICATIONS

Chung–Hsing Chen et al, "Behavorial Synthesis for Testability", Proc. of Int'l Conf. on Computer–Aided Design, pp. 612–615, Nov. 1992.

Vivek Chickermane et al, "A Fault Oriented Partial Scan Design Approach", Proc. of the Int'l Conf on Computer–Aided Design, pp. 400–403, Nov. 1991.

Tien–Chien Lee et al, "Behavorial Synthesis for Easy Testability in Date Path Allocation", Proc. of IEEE Int'l conf. on Computer Design, Oct. 1992, pp. 1–4.

Robert A. Walker et al, *A Survey of High–level Synthesis Systems* Kluwer Academic Publishers, Boston, MA. 1991, pp. 3–34.

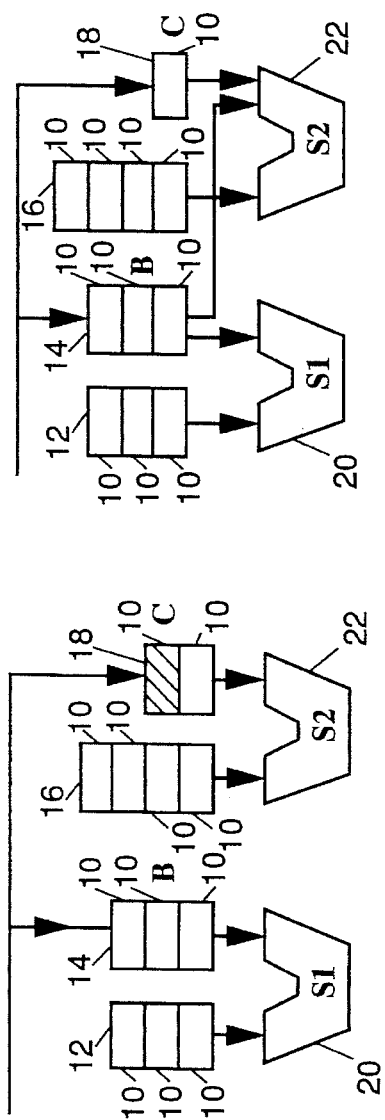
FIG. 1a
FIG. 1b
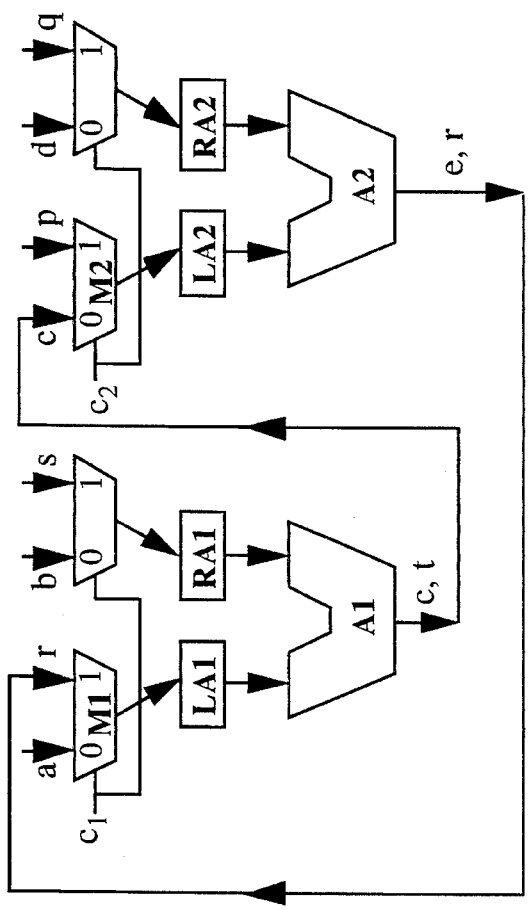
FIG. 4b
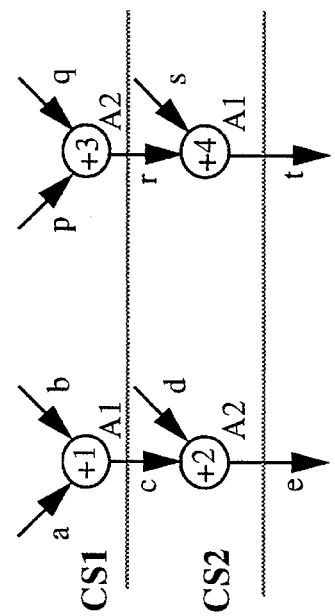
FIG. 4a

| Variables | Lifetime | Source | Register Assignment |
|---|---|---|---|
| 1->0,12 | 1-14 | PI | L5 |
| 0->1,9,10 | 1-11 | A1 | L1 |
| 1->2,6,7 | 2-7 | A1 | L2 |
| 2->4 | 3 | A1 | L3 |
| 6->19 | 7-8 | A1 | L3 |
| 12->13 | 15 | A1 | L5 |
| 19->22 | 9 | A1 | L3 |
| 32->33 | 16 | M1 | L5 |
| 33->31 | 17-14 | A1 | L4 |

HIGH LEVEL SYNTHESIS FOR PARTIAL SCAN TESTING

BACKGROUND OF THE INVENTION

The present invention relates to high level synthesis of integrated circuits and specifically to synthesis for testability and efficiency in hardware shared implementation of such circuits by partial scan techniques. Quite specifically, the invention concerns hardware sharing for minimizing the quantity of scan registers required to break loops in data paths in order to perform partial scan testing of integrated circuits.

High level synthesis encompasses a variety of synthesis tasks, such as partitioning, module selection, and transformations, each of which has the potential to influence a number of design parameters, e.g., area, speed, and power. However, only allocation, scheduling, and assignment are widely recognized as mandatory tasks in high level synthesis. Allocation is the step during which it is decided how many basic blocks of each type of hardware unit (e.g. adder) will be used in the design. Scheduling is the step during which the temporal location within an interval of available time for each operation is fixed. Assignment is the step which assigns instances of operations to hardware units in the design.

A great variety of scheduling, allocation, and assignment algorithms have been studied in the high level synthesis literature. Examples are found in the article by M. C. McFarland et al, entitled "The High-Level Synthesis of Digital Systems" in Proceedings of the IEEE, 78(2):301–317, 1990 and in the book by R. Walker et al, entitled "A Survey of High-Level Synthesis Systems, Kluwer Academic Publishers, Boston, Mass. 1991. While the underlying algorithmic techniques vary from very simple heuristics to involved formal techniques, the goal of almost all the algorithms has been optimization of speed under resource constraints or its dual. More recently, the list of targeted goals was enhanced to include fault tolerance and testability.

It is widely recognized that testability of a circuit is dependent upon the testing methodology selected. The high level synthesis for testability methods can be broadly classified into two groups—BIST-based (built-in-self-test) and ATPG-based (automatic test pattern generation). The BIST-based methods assume the presence of a pseudo-random pattern generator for test vector generation and a MISR (multiple-input signature register) or other signature analyzers for response compression. Almost all BIST approaches assume a full-scan design methodology since random testing is not well-suited for non-scan sequential circuits.

ATPG-based testing methods assume that the test patterns would be generated by deterministic automatic test pattern generators. These techniques do not routinely assume full-scan, however, for ease of sequential circuit test generation, some techniques assume the presence of partial scan. Testability improvement using register assignment and scheduling was reported by T. C. Lee et al in an article entitled "Behavioral Synthesis for Easy Testability in Data Path Allocation" in Proc. of the Int'l Conf. on Computer-Design 1992 and by T. C. Lee et al in an article entitled "Behavioral Synthesis for Easy Testability in Data Path Scheduling" in Proc. of the Int'l Conf. on Computer-Aided Design, pp. 616–619, 1992, respectively. In both cases, testability improvement was actually demonstrated by running a sequential test pattern generator, STEED from the University of California at Berkeley. Chen and Saab describe in an article entitled "Behavioral Synthesis for Testability" in Proc. of the Int'l Conf. on Computer-Aided Design", pp. 612–615, Nov. 1992 the use of a high-level testability analysis program to identify testable structures and synthesize them to improve testability. An approach to generate testable data paths, by minimizing the number of self-loops, was reported by A. Majumdar et al in an article entitled "Incorporating Testability Considerations in High-Level Synthesis" in the Proc. of the Int'l Sym of Fault-Tolerant Computing, 1992. However, the actual fault coverages were not reported. More recently. Lee et al developed a method to minimize formation of loops in the data path by partial scan and proper register assignment as described in an article entitled "Behavioral Synthesis of Highly Testible Data Paths Under the Non-Scan and Partial Scan Environments" in Proc. Design Automation Conf. pp. 292–297, 1993.

Several researchers have attempted to improve the testability of circuits by manipulating the R2 (register transfer)-level description. It has been shown that the use of RT-level information to select scan flip-flops results in significantly better performance when compared to techniques limited to gate-level information only. Also, transformation and optimization techniques have been proposed which utilize RT-level information to generate optimized designs that are 100% testable under full scan.

An object of the present invention is to synthesize designs which are easy-to-test by a gate-level sequential deterministic automatic test pattern generator. There are several factors which influence the testability of a sequential circuit. The dependencies of the flip-flops (FFs) of a sequential circuit is captured by an S-graph, where each node corresponds to a FF. There is a directed edge from node u to node v if there is a combinational path from FF u to FF v in the sequential circuit. It is known that sequential test generation complexity might grow exponentially with the length of the cycles in the S-graph. The sequential test generation complexity grows only linearly with the longest path (sequential depth) in the S-graph.

The scan flip-flops are selected so that the S-graph has no cycles except self-loops, and the sequential depth is minimal. A sequential circuit with no loops, other than self-loops, and having low sequential depth, is easily-testable by current deterministic sequential test pattern generators.

Most of the hard-to-detect faults in a sequential circuit are found in moderately sized and large-strongly connected components (SCCs). Cliques should be broken with high priority and hard-to-detect faults seldom occur in self-loops. As a result, there has been developed a highly efficient partial scan approach at the gate-level, which selects scan FFs using the knowledge of faults aborted by the test pattern generator.

In U.S. Pat. No. 5,043,986 issued in the names of Agrawal and Cheng, a method of partial scan design for chip testing is dscribed. Tim method involves establishing a subset of the memory elements of a circuit. The subset is chosen such that, while in a test mode, substantially all feedback paths equal to or greater than a selected cycle length in the circuits are eliminated. Preferably, the scan elements are selected to eliminate all cycles of a circuit. The patent describes the existence of loops at the gate level and the solution is a test design for gate level testing.

The present invention considers high level synthesis circuit design along with the testability of the circuit being designed. That is, all sources of loops created in the data path are identified. The present invention also describes a method which simultaneously schedules and assigns the operations in a manner for generating a design which has low hardware cost and low partial scan testing overhead cost. The hardware sharing is designed into the circuit at the time of high level synthesis in a manner to avoid the formation of loops. The invention considers all loops formed in the data path namely: CDFG (control data flow graph) loops which are produced in the data path irrespective of the scheduling and assignments as a consequence of the loops in the corresponding CDFG; assignment loops which are produced whenever two or more operations in the path of a CDFG are assigned to the same module; false loops which are produced when multiple operations in disjoint paths are assigned to the same modules under certain conditions; and register file cliques which are formed when multiple registers belonging to a module receive an input from the output of the same module. The operations are scheduled and assigned for avoiding the formation of loops in the data path, while preserving high resource utilization.

SUMMARY OF THE INVENTION

Since the invention is primarily concerned with computation-intensive application domains, e.g., DSP and graphics, the controller is typically at least an order of magnitude smaller than the datapath, and usually its states need only a few FFs. In accordance with the teachings of the present invention, it is assumed that all the control signals to the data path, are to be made fully controllable through partial scan of the state FFs of the controller.

The present invention concerns generating easily testable data paths from high-level specifications and achieving high resource utilization, while satisfying given performance constraints. The data path is made easily testable by ensuring that the synthesized data path has no loops, except self-loops. As used herein the term "loops" will be understood to refer to loops of length greater than one. A minimal-loop data path satisfies other metrics of gate level testability of sequential circuits. In particular, the test generation complexity will be linear with the number of FFs for a loop-free data path. Also, since a SCC represents a group of tightly interconnected loops, absence of loops imply absence of such SCCs in the data path. Consequently, the data path should not have many hard-to-detect faults. The partial scan methodology is used to synthesize a minimal-loop data path from CDFG descriptions.

Hardware sharing is a widely used methodology to achieve high resource utilization, but it might adversely affect the testability of a circuit by introducing new loops in the data path. However, in accordance with the teachings of the present invention, when hardware sharing is exploited properly in conjunction with the partial scan methodology, improvements in testability can be achieved despite the possible introduction of loops. The scan registers can be shared amongst several variables of the CDFG, to break not only the loops in the CDFG, but also the loops introduced in the data path by hardware sharing.

A principal object of the present invention is therefore, the provision of a method of high level synthesis of an integrated circuit using hardware sharing for minimizing the quantity of scan registers needed to synthesize a testable data path.

Another object of the present invention is the provision of a method to improve testability at a low cost while ensuring high resource utilization.

A further object of the present invention is the provision of a method useful for synthesizing integrated circuits of very easily testable designs, with very low hardware overhead and without compromising the performance of the designs.

A still further object of the invention is the provision of a method for identifying and breaking all loops, except self-loops, formed in the high level synthesis of integrated circuits.

Further and still other objects of the present invention will become more clearly apparent when the following description is read is conjunction with the accompanying drawings.

BRIEF DESCRIPTION OF THE DRAWING

FIG. 1a is a schematic representation of a register file model;

FIG. 1b is a schematic representation of an alternative register file model;

FIG. 2b is a schematic representation of the data path of the CDFG shown in FIG. 2a;

FIG. 3b is a schematic representation of the data path of the CDFG shown in FIG. 3a;

FIG. 3c is an S-graph corresponding to the CDFG shown in FIG. 3a;

FIG. 4a illustrates segments of two paths in a CDFG;

FIG. 4b is a data path representative of the CDFG shown in FIG. 4a;

FIG. 6b is a schematic implementation of the data path of the CDFG shown in FIG. 6a;

FIG. 7b is a schematic implementation of the data path of the CDFG shown in FIG. 7a.

DETAILED DESCRIPTION OF THE INVENTION

Figure 2A:
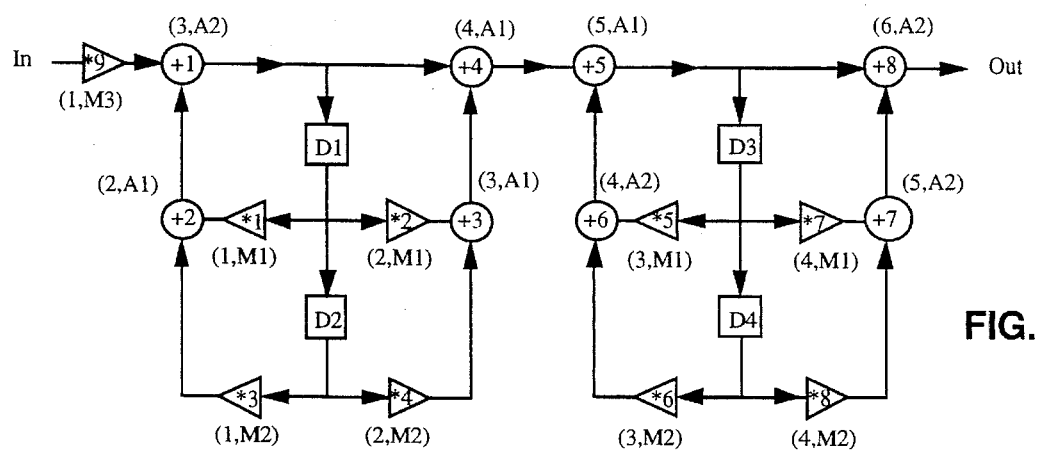
FIG. 2a is a control data flow graph (CDFG) of a 4th order IIR cascade filter.

It has been widely recognized that the implementation area in hardware shared architectures is most often dominated by interconnect requirements. Addressing interconnect issues, during high level synthesis, is often postponed until a time when all major design decisions have already been made. This is due to the fact that it is very difficult to accurately correlate interconnection requirements at a behavioral and register transfer (RT) level to that at a physical level. An effective solution to the problem can be achieved if the hardware model shown schematically in FIG.

1a is used. The model in FIG. 1a is called a register file model, where all registers 10 are clustered in a number of registers files 12, 14, 16 and 18. While each execution unit can send data to any register file in the general case, each register the is connected to one input of a single functional unit 20 or 22, respectively.

Numerous variations of the hardware model, where registers are grouped in register files and access to a particular register is limited to only one functional unit, are widely used in industrial designs. A number of fully operational high level synthesis systems, such as Cathedral-II and Hyper, are also based in a register file model. An advantage for adapting the described hardware model is that its intentional restrictions enforce a limitation on the number of interconnects and encourages use of local interconnects (between register files and execution units). Also, in the model, the interconnects can be effectively shared. Moreover, the area needed for laying out registers and the combined control logic which are grouped in register files is significantly lower than the area required by interconnects.

FIGS. 1b is a schematic representation of an alternative register file configuration which illustrates advantages and disadvantages of the adopted hardware model. Assume, for example, that in a particular control step it is necessary to store a variable which is needed to be executed in a subtractor 22. While all the registers in the register file 18 are already occupied, there is at least one free register in the register file 1,1. There are two possibilities: (1) increase the number of registers in the register the 18 by 1; or (2) introduce a new interconnect from the register file 14 to the right input of subtractor 22. The file register model enforces the use of the first alternative, which is, due to the above described reasons, most often superior to the second alternative. While the invention will be described in conjunction with the register the model shown in FIG. 1a, it will be apparent to those skilled in the art that with minor modification it will be possible to apply the invention to embodiments where the interconnect restrictions are different or are eliminated.

In order to better understand the teachings of the present invention, reference is made to FIG. 2a, which illustrates one possible schedule and assignment under specified Liming constraints control data flow graph (CDFG) of a 4th order IIR cascade filler. The highest throughput implementation is targeted and each operation in the CDFG takes one control cycle. The critical path from delay D1 (or delay D2) to Out is 6 control cycles long. For example, the operation +2 is scheduled to control cycle 2 and is assigned to be executed in adder A1 as indicated by the ordered pair (2, A1) in the figure next to the operation +2. The design in FIG. 2a has a minimal quantity of execution units.

Figure 2B:
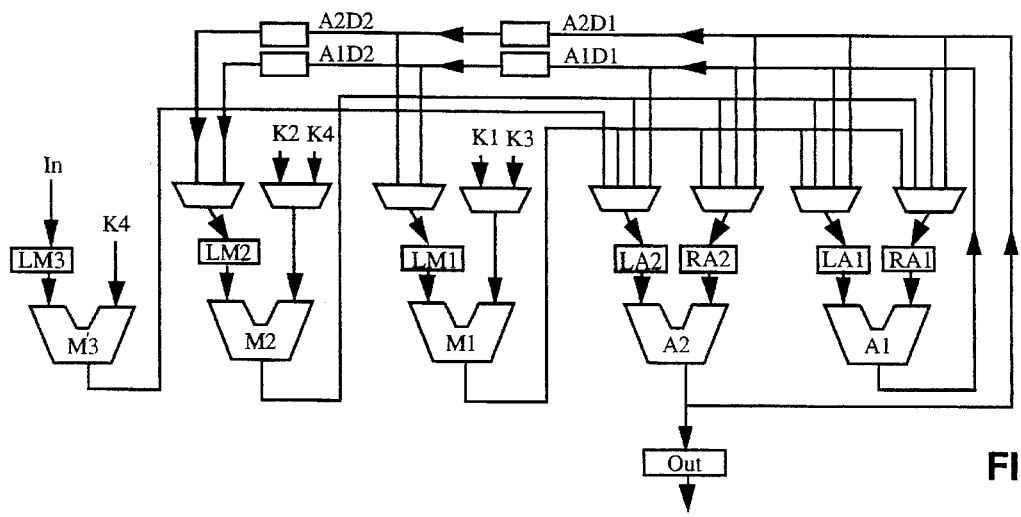
Figure 2C:
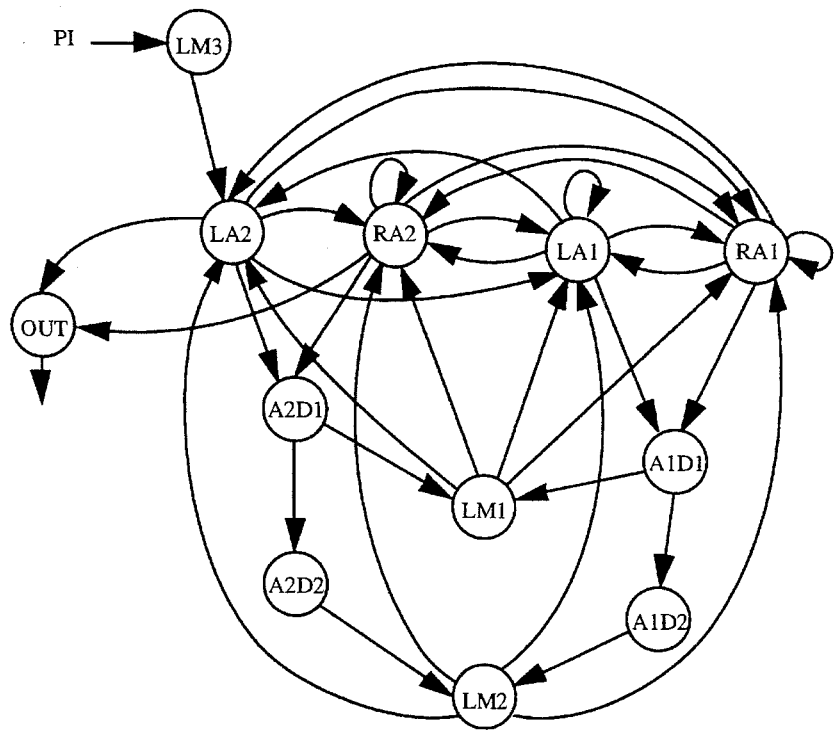
FIG. 2c is all S-graph corresponding to the CDFG shown in FIG. 2b.

The resultant data path of the CDFG in FIG. 2a is shown in FIG. 2b. The corresponding S-graph is shown in FIG. 2c. Similar to the S-graph of a gate-level sequential circuit, the S-graph of a data path identifies the dependencies between the registers of the data path. Each node in the S-graph represents a register in the data path. There exists an edge from node u to node v if register v depends on register u. The S-graph in FIG. 2c reveals the existence of several loops involving the registers of the data path. The longest loop in the S-graph has a length of 7. As can be expected, the data path is very hard to test, as indicated by the row IIR.16 unit in Table 2 below.

The testability of the data path can be improved by using partial scan techniques at the gate-level to break all the loops of the circuit. Breaking all the loops of the S-graph in FIG. 2c requires scanning at least 3 registers, namely LA1, LA2, and LM1, which translates to 3n FFs, where n is the wordsize. However, the associated area and performance overheads due to the large number of scan FFs can be prohibitive.

Figure 3A:
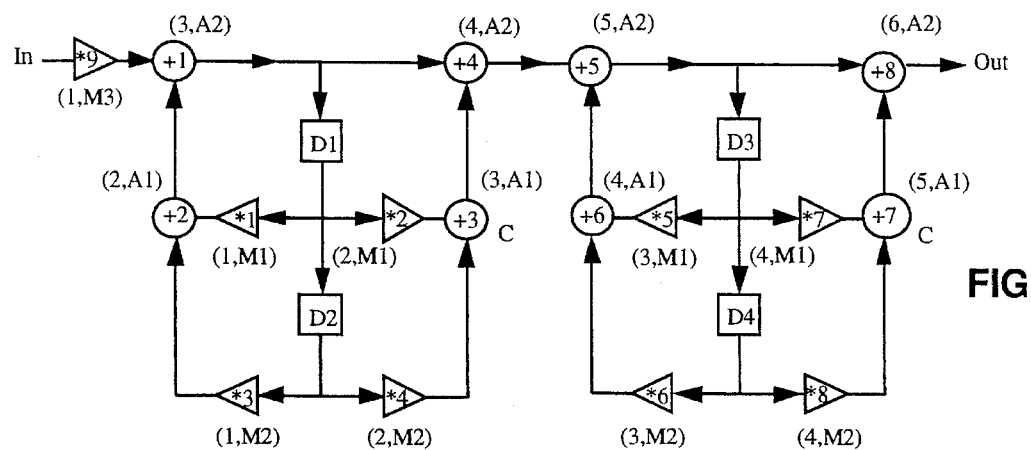
FIG. 3a is a control data flow graph of the IIR cascade filter shown in FIG. 2a with a different schedule and assignment.
Figure 3B:
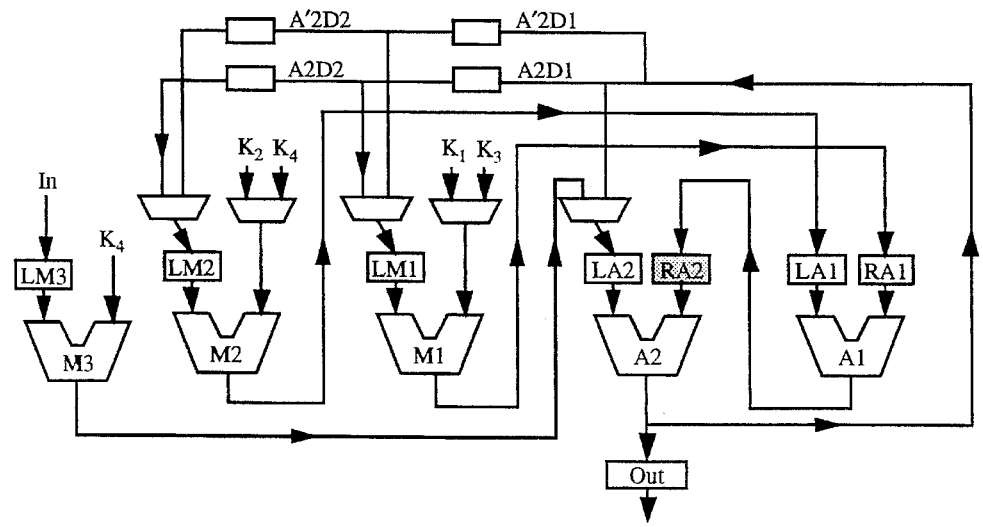
Figure 3C:
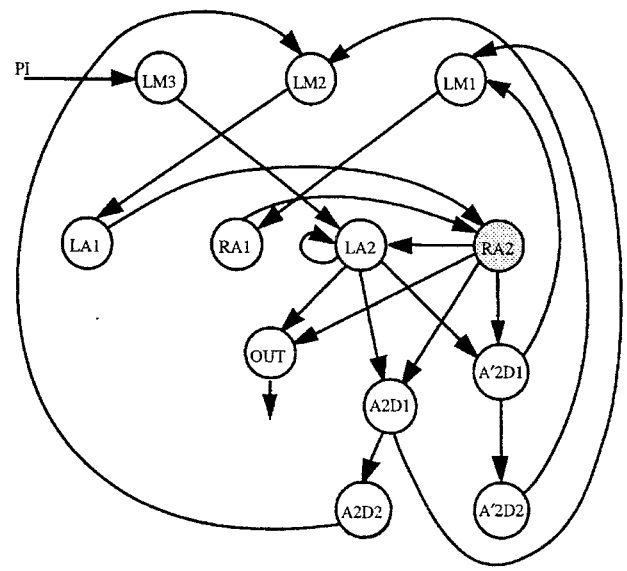

The example in FIG. 2a, 2b and 2c illustrates how hard-to-test data paths can be generated if testability of the data path is not considered during the initial phases high-level synthesis. Instead of delaying the task of making the design testable to the gate-level, it is possible to incorporate testability as one of the original design goals, in addition to the conventional goals of performance and resource utilization, during the various high-level synthesis tasks. FIG. 3a shows the same flow graph of the IIR filter, with a different schedule and assignment, satisfying the same performance constraints as before. Note that this solution is also optimal with respect of the number of execution units used. Moreover, this implementation is optimal with respect to two other important resource cost components, the quantity of registers and interconnects. More importantly, from a testability point of view, the corresponding data path, and the S-graph, shown in FIGS. 3b and 3c, respectively, are significantly more amenable to sequential testability then those in FIGS. 2b and 2c. The S-graph still has loops; however, scanning register RA2 (drawn shaded) will break all the loops. The resultant data path, with register RA2 scanned, has no loops, and is very easy-to-test. A test efficiency of 100% could be achieved on the resultant data path, as evidenced by the row IIR.16 Final in Table 2 below.

In order to further understand the present invention, it is necessary to understand the source of loops in the data path, and its corresponding S-graph. In the hardware model described above the first type of loops, CDFG loops, are produced in the data, path due to the presence of loops in the CDFG. Assignment loops, false loops and register-the cliques are formed due to hardware sharing during scheduling and assignment.

The most obvious source of loops in the data-path, and hence in the S-graph, is the presence of loops in the CDFG. A CDFG loop is formed in the data path if there exists a cycle comprising data dependency edges in the CDFG. For example, in FIG. 2a, the CDFG loop ($+_5$, D3, $*_5$, $+_6$, $+_5$) will produce a loop in the data path, irrespective of the register and module assignments used. If the assignment shown in FIG. 2a is used, the loop (RA1,A1D1,LM1,RA2,RA1) is produced in the corresponding data, path. Similarly, the assignment shown in FIG. 3a produces the loop (RA2, A2D1,LM1,RA1,RA2).

In general, each cycle in the CDFG always produces a loop in the data-path S-graph, irrespective of the allocation, scheduling, and assignment performed. Regardless of whether hardware sharing has been employed or not, the CDFG loops translate to loops in the data path. CDFG loops are very common in the structures of many algorithms in areas like DSP and numerical calculations.

An assignment loop is created whenever two or more operations in the path of a CDFG are assigned to the same module. If two consecutive operations are assigned to the same module, a self-loop (loop of length one) is created. For example, in the CDFG shown in FIG. 2a assigning the consecutive operations $+_4$ and $+_5$ to the same module A1 creates the self-loop (LA1—LA1) in the data path (FIG. 2c).

When the opera,lions along a CDFG path from operation u to operation v are assigned n, separate modules, with u and v being assigned the same module, a loop of length n is created in the data path. Consider the path ($+_1$, $+_4$, $+_5$, $+_8$) in the CDFG shown in FIG. 2a. Assigning operations $+_1$ and $+_8$ to the same module A2, and the intermediate operations $+_4$ and $+_5$ to module A1, creates a loop (LA2,LA1,LA2) of length two in the S-graph of FIG. 2c.

A sequential loop in the data path is termed false when the loop cannot be sensitized under normal operating conditions. A false loop is a special case of a false path. FIG. 4a and 4b illustrate the formation of a false loop in the data path. FIG. 4a shows segments of two paths in a CDFG, where operations $+_1$ and $+_3$ are scheduled in control step 1, and $+_2$ and operation $+_4$ are scheduled in control step 2. If operations $+_1$ and $+_2$ are assigned adders A1 and A2, respectively, no assignment loop is formed. Similarly, assigning operations $+_3$ and $+_4$ to adders A2 and A1 respectively, ensures maximum resource utilization, while avoiding the formation of any assignment loops. However, the resulting data path in FIG. 4b shows the formation of a sequential loop: A1, M2, LA2, A2, M1, LA1, A1. To sensitize the loop, the required control signals to the multiplexors M1 and M2, c1 and c2, should be {c1=1,c2=0} (or, {c1=0, c2=1}) in any two consecutive control steps. However, this necessitates execution of operations $+_4$ followed by $+_2$ (or $+_2$ followed by $+_4$), which is clearly not possible. Consequently, the sequential loop can never be sensitized under normal operating conditions, and is a false loop.

Combinational false loops, are generated in the data path when data-chaining is allowed, that is two or more operations are scheduled in the same control step. However, even when data-chaining is not allowed, hardware sharing can still lead to a different type of false loop in the data path, sequential false loops, as shown in FIG. 4b. Corresponding to each sequential false loop involving two or more registers in the data path, there exists a false loop in the S-graph involving the same registers. Since it is assumed that the control signals to the data path are fully controllable, the false loops act as real loops during test generation. Hence, though sequential false loops do not create problems for other CAD tools, they contribute to the complexity of sequential test pattern generation in the same way as other loops.

When a module $M_i$ has a register file associated with each input, the registers in the register files may form a register file clique in the S-graph. A register belonging to a register file of Module $M_i$ is termed a self-loop register if it receives S data from $M_i$, besides possibly other modules. Each self-loop register of module $M_i$ has a path through module $M_i$ to (from) itself and all other self-loop registers of $M_i$. In the corresponding S-graph, each self-loop register has an edge to (from) the other self-loop registers of module $M_i$. Consequently, if the left and right register files of module $M_i$ have m and n self-loop registers respectively, then a clique of size (m+n) is formed in the S-graph.

Figures 5A, 5B:
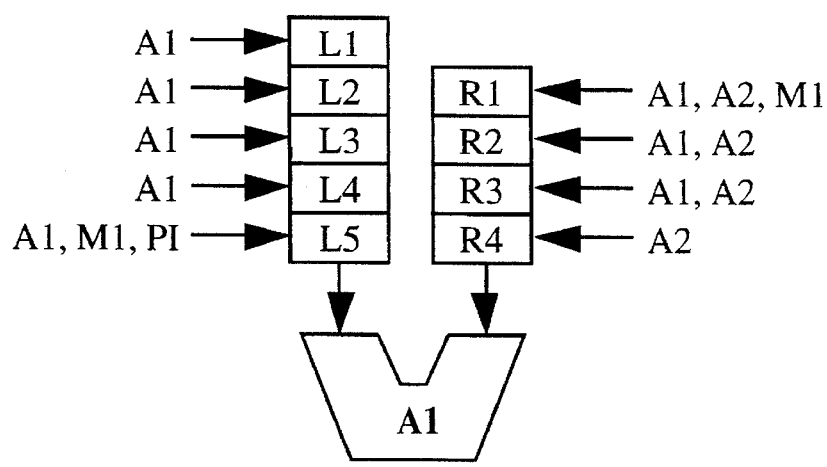
FIG. 5a is a table of lifetimes and register assignments of variables assigned to the left register file in FIG. 5b.
FIG. 5b is a schematic representation of left and right register files of a module A1.
Figure 6A:
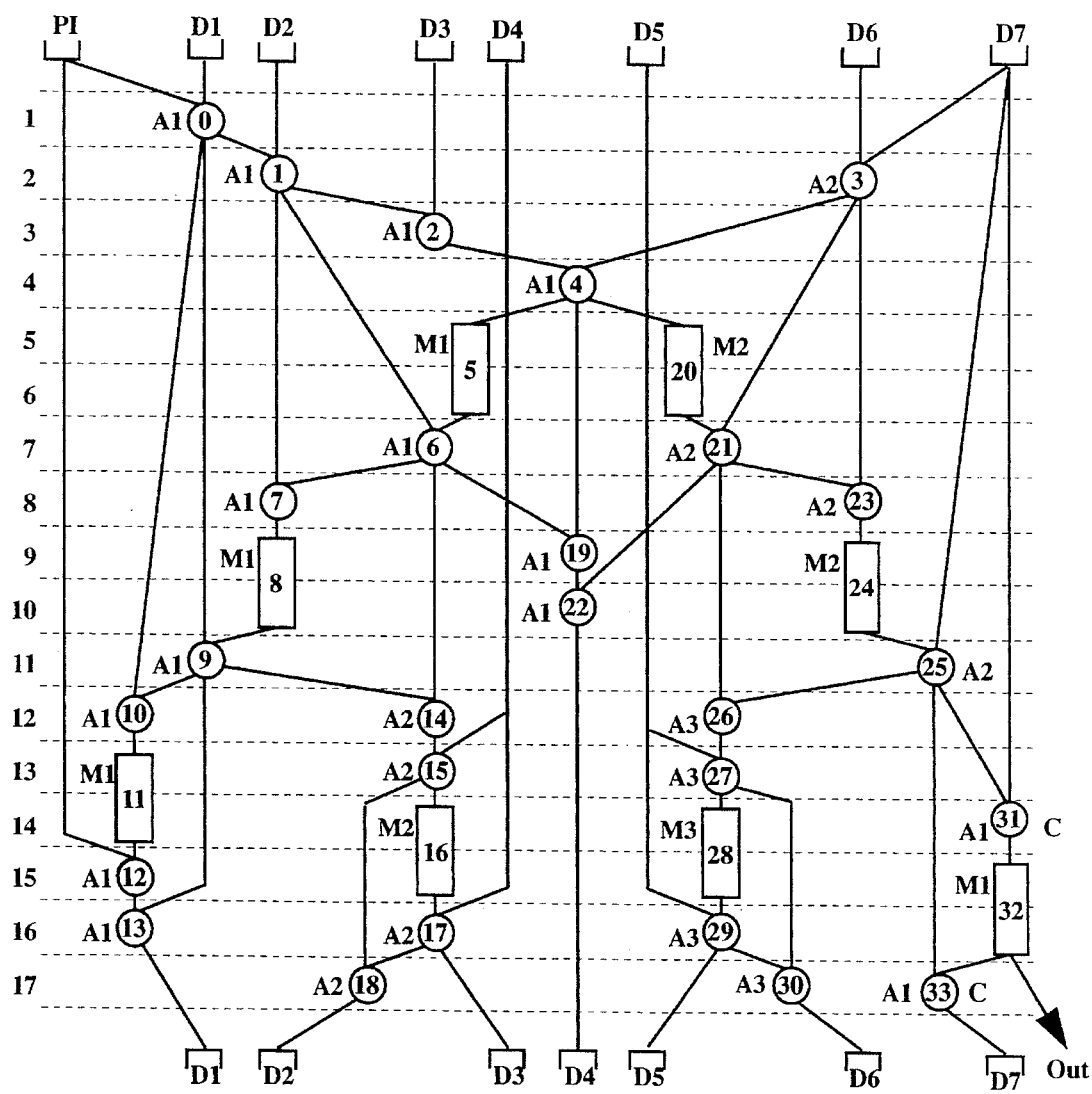
FIG. 6a is a scheduled and assigned control data flow graph of a 5th Order Wave Digital Eliptical Filter synthesized for resources utilization.
Figure 6B:
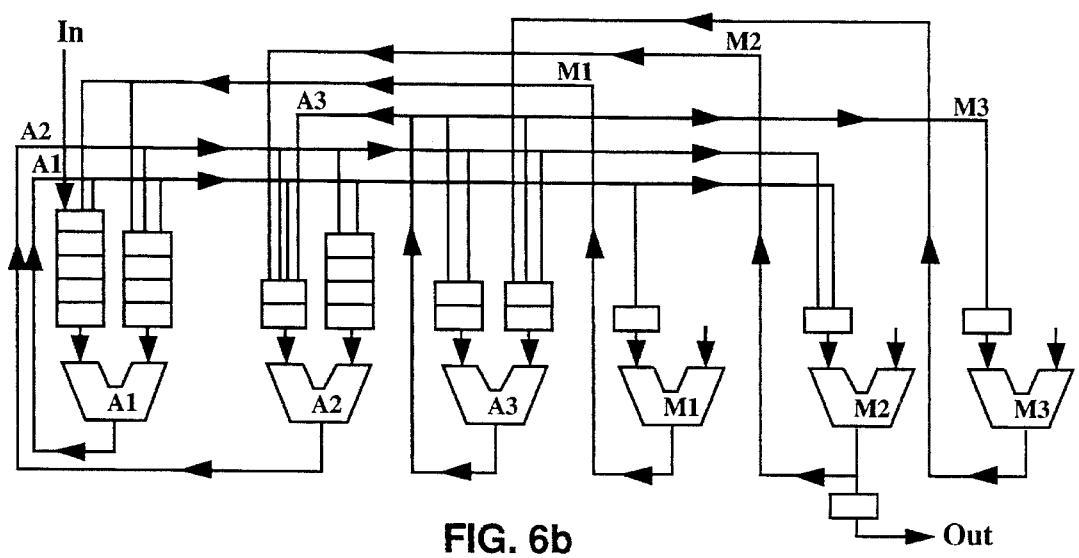

FIG. 5b shows the register files of module A1, one of the adders used in the data path of the elliptical wave filter shown in FIG. 6b. The assignment of operations to modules is shown in FIG. 6a. The left operand of each operation mapped to A1 has to be assigned to some register of the left register-file of A1. This assignment is also shown in FIG. 5a. Multiple registers are required due to conflicts in the lifetimes of the variables. For instance, the variables (0,10), (1,7), (6,19) and (33,31) are all alive in the 7th control step, and hence need to be assigned to four different self-loop registers. The left register file has 5 registers: {L1 ... L5}, and the right register file has 4 registers: {R1 ... R4}. The inputs of the registers are shown. For instance, register L1 has a single input coming from module A1, while register R1 has three inputs, A1, A2 and M1.

Since there are 5 self-loop registers in the left register file of A1, and 3 self-loop registers in the right register file, a clique involving the 8 self-loop registers is formed in the corresponding S-graph.

Since each register in a clique is completely connected with all the other registers of the clique, breaking all the loops of a clique of size k requires scanning k-1 registers. This means that formation of cliques not only makes test pattern generation very hard, it makes a partial scan solution very expensive.

In devising the present method of hardware sharing in high level synthesis or circuits for partial scan testing optimization several goals were imposed during scheduling and assignment which simultaneously address both hardware resource utilization and testability issues while satisfying the throughput constraints. In order to design a hardware competitive circuit, it is essential to consider each of the three components of implementation cost: execution units, registers and interconnects. The additional consideration of testability imposes restraints on all four types of loops in the data path graph and to a lesser extent on sequential depth.

Figure 8:
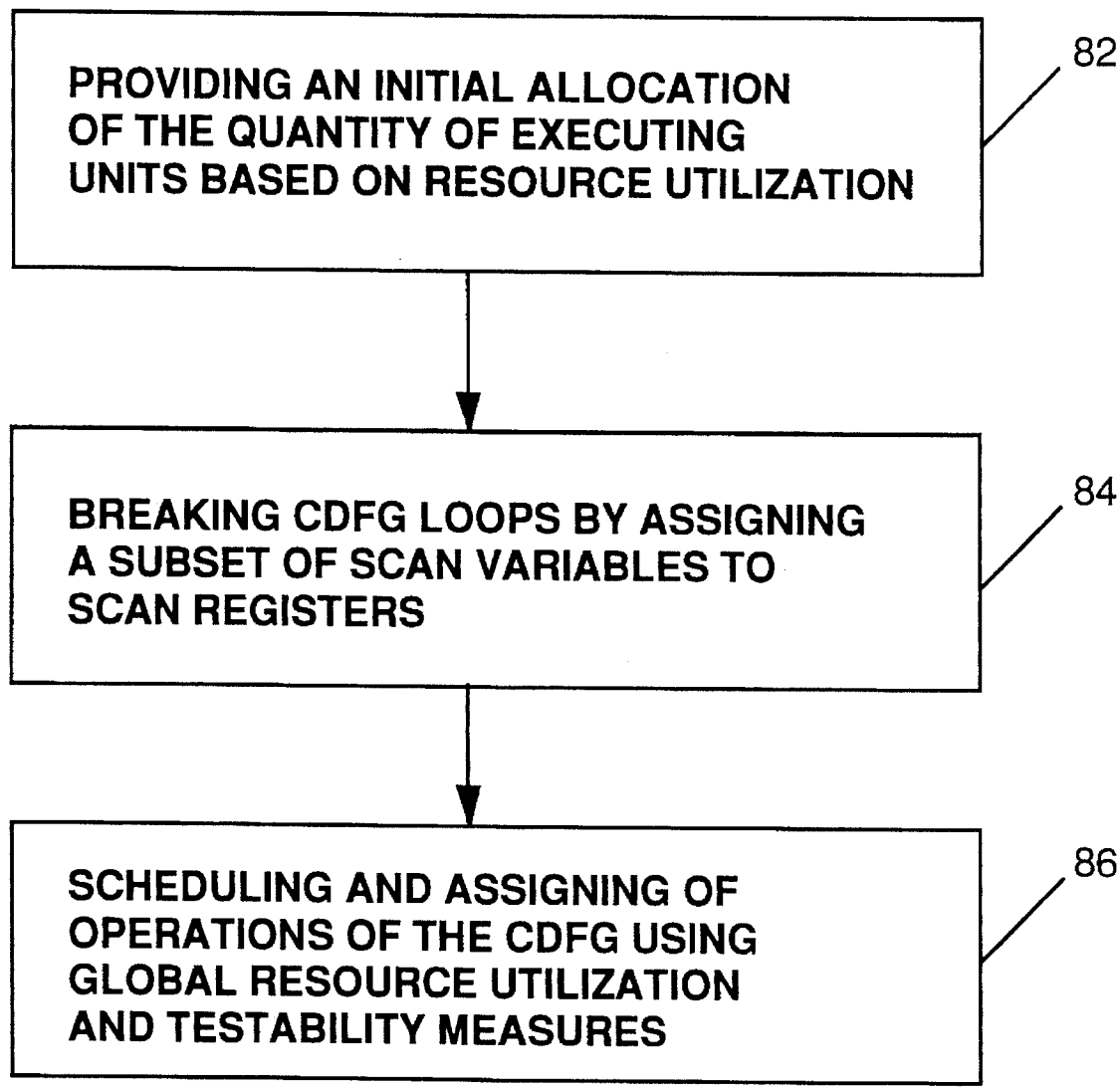
FIG. 8 is a flow diagram of a preferred method for practicing the invention.

The present method as shown in FIG. 8 includes three phases. In a first phase 82, a conventional high level synthesis system provides an initial allocation of the quantity of execution units targeting resource utilization exclusively. The Hyper system from the University of California at Berkeley was used for the execution circuit allocation. The Hyper system is described in an article by J. Rabaey et al entitled "Fast Prototyping of Datapath-Intensive Architectures" in IEEE Design and Test of Computers, pages 40 to 51, June 1991. In a second phase 84, all CDFG loops are broken by assigning a subset of variables (scan variables) to scan registers. Each operation which consumes at least one scan variable is assigned to an execution unit (module), and the scan variable is assigned to the associated register file. In a third phase 86, there is a simultaneous scheduling and assigning of each operation of the CDFG using global resource utilization and testability measures.

Having determined the initial allocation of the quantity of execution units in the first phase, the problem is breaking the CDFG loops using a minimal quantity of scan registers.

A related problem involving the case of S-graphs of gate-level circuits has been previously addressed in the prior art. In the gate-level circuit case, the minimum quantity of scan registers required is equal to the minimum quantity of vertices of the S-graph which when scanned, will break all of the loops in the S-graph. Since the minimum feedback vertex set problem is NP complete, several heuristics exist in the prior art to solve the problem.

When hardware sharing is not used, a solution to the minimum feedback vertex set problem can be directly applied to break the CDFG loops. However, in accordance with the teachings of the present invention when hardware sharing is used, the minimum feedback vertex set is not necessarily a good solution, since at the CDFG level, the variables selected to break the loops (scan variables) can share the scan registers.

The new dimension added by hardware sharing to the problem of breaking loops is illustrated by the CDFG, the data path and the S-graph of the IIR filler shown in FIGS. 2a. 2b and 2c respectively. A possible solution to the minimum feedback vertex set problem is the edges: {($+_1$,D1), ($+_5$,D3) }. However, since the variables D1 and D3 are simultaneously active in the first control step, they cannot be shared, thus requiring 2 scan registers to break the CDFG loops. On the other hand, if scan variables $(+_2, +_1)$ and $(+_6, +_5)$ are selected, all CDFG loops are broken. The scan variables are stored in the same scan register since their lifetimes do not overlap, regardless of the schedule and assignment used.

Another known approach is to cut CDFG loops using a subset of boundary variables (variables which correspond to the edges with delays). Since all boundary variables exist simultaneously, each selected variable has to be assigned to a separate scan register. In order to maximize the likelihood of reuse of the scan registers, boundary variables having short lifetimes are selected. Later, during register assignment, the boundary modules share scan registers among intermediate variables to minimize the formation of assignment loops in the data path.

While the known approach introduces the important idea of sharing scan registers, the technique does not exploit hardware sharing while selecting scan variables to break CDFG loops. Firstly, in the known technique all boundary variables simultaneously exist (in the first control step), and therefore cannot share scan registers. In contrast, in accordance with the teachings of the present invention, the step of considering all variables in the CDFG loops as possible candidates for scan variables, greatly improves the possibility of efficient sharing of scan registers. Consider the IIR filter shown in FIG. 2a. Limiting the choice of scan variables to boundary variables results in the use of two scan registers. However, considering all variables in the CDFG loops results in a solution which uses only a single scan register, as described above.

Secondly, the length of lifetimes of variables has only indirect and second order effect on hardware sharing. The necessary and sufficient conditions that two variables can share the same register are that they do not simultaneously exist and that a proper interconnect for transferring the two variables is allocated.

In the present invention, the object of breaking CDFG loops is to select a set of scan variables such that the following three criteria are simultaneously satisfied: all CDFG loops, except self-loops, are broken; the selected scan variables can be assigned to a minimal quantity of scan registers; and, the scan registers are reusable in order to break the other loops formed during the subsequent scheduling and assignment phase.

The above criteria are the minimum hardware-shared cut (HSC) problem. When no hardware sharing is allowed, the minimum HSC problem reduces to the minimum feedback vertex set problem. Consequently, an exact algorithm for the minimum HSC problem is at least as computationally intensive as the minimum feedback vertex set problem, which is known to be NP-complete.

In the present invention the minimum HSC problem is addressed by using an approach which combines probabilistic and heuristic techniques. Two measures are used to capture the effectiveness of a variable in satisfying the three criteria of the minimum HSC problem.

The loop cutting effectiveness (LCE) measure helps to satisfy the first criteria, of the minimum HSC problem. The LCE measure of a variable estimates the quantity of loops that will be broken by assigning the variable to a scan register. Since the quantity of loops can be exponential, and there is no known algorithm to count the loops efficiently, a random walk methodology is applied.

The random walk starts by assigning a unit value to each node of the CDFG. In each successive iteration, the value at each node v is propagated along one randomly selected directed edge from v to one of its neighbors. Each time an edge is used to propagate the value, the congestion factor of the edge is incremented. The number of iterations is user specified, in the present invention, the preferred number is a quadratic function of the number of nodes in the CDFG. At the termination of the random walk, the congestion of each edge of the CDFG gives an estimate of the number of loops the respective edge belongs to, which estimate is used as the LCE measure.

The hardware sharing effectiveness (HSE) measure is introduced to satisfy the second and third criteria of the minimum HSC problem. The HSE of a variable v estimates the likelihood that v can share a scan register with other variables which may be needed to break all four types of loops in the data path. It consists of the two components listed below.

The first component addresses the second criteria of selecting scan variables, which is, minimization of the quantity of scan registers required to cut the CDFG loops. The highest HSE value is assigned to variables which have the least overlap in lifetimes with candidates for scan variables from other SCCs of the CDFG. Since the operations have not been scheduled yet, an estimate of the lifetime is calculated using the ASAP and ALAP timing informations. These calculations are described in R. A. Walker et al, supra.

The second component measures the likelihood that a scan register SR1, to which the variable v will be assigned, can be effectively reused later to break the other three types of loops. Let $f_v$ be the type of the operation to which variable v is an input. In the context of the present hardware model, SR1 can be shared only by the set of variables {x} which are inputs to operations of the same type $f_v$, and whose lifetimes do not overlap with the lifetime of v. An estimate of the lifetimes is used to determine the variables whose lifetimes do not overlap with v. The second component is set to be the cardinality of the set {x}, thus favoring a variable whose assigned scan register can be reused later by the largest number of variables.

An algorithm to select scan variables to cut the CDFG loops is as follows:

--- select_scan_variables()
1. Identify non-trivial strongly connected components (SCC), which have at least two nodes.
2. For each edge e which belongs to some SCC, calculate
   $eff_{HSC}(e) = \alpha_1 * LCE(e) + \beta_1 * HSE(e)$.
3. For each SCC, select as scan variable the edge e with highest $eff_{HSC}(e)$.
   Delete the selected edges from the CDFG.
4. If there exists any SCC, go to step 1.
5. Assign the selected scan variables to register files.

---

After the scan variables have been selected to cut the CDFG loops, at first, a minimum set of scan registers is identified to which all the scan variables can be assigned. This can be done optimally by assigning all scan variables with disjoint lifetimes to the same scan register. As a second step, the scan registers are selected from as many register files of as many execution units as possible. The second step increases the chances of reusing the scan registers to assign variables to avoid the formation of loops during scheduling and assignment.

The process of selecting scan variables using the IIR filter shown in FIG. 3a will be used as an illustration for the method. The edges $\{(+_2, +_1), (+_1, D1), (+_6, +_5), (+_5, D3)\}$ get maximally congested during random walk, and hence obtain the highest LCE values. Note that these variables cut the maximum number of loops. The variables {(+$_2$, +$_1$), (+$_6$, +$_5$)} score high in both of the components of the HSE measure, since their lifetimes do not overlap with each other, and the cardinality of set {x} is maximal. Hence, the algorithm select_scan_variables will select the variables {(+$_2$, +$_1$), (+$_6$, +$_5$)}, and assign them to the same scan register.

After the CDFG loops have been broken using a minimal set of scan registers, in the third and final phase, each operation of the CDFG is simultaneously scheduled and assigned using global testability and resource utilization measures. The object is to produce a testable data path, avoiding the formation of the three types of loops mentioned before. However, priority is also given to use a schedule and assignment which satisfies the constraint on control steps and which maximizes resource utilization, so that the final design is not only testable, but also competitive in terms of hardware cost.

At each iteration of the algorithm, from the operations that have not yet been scheduled and assigned, an operation $op_i$ with least slack (ALAP—ASAP) is selected. The set of (module, control step) pairs, $\{(M_i, C_i)\}$, to which/in which the operation an be assigned/scheduled, are identified. For each pair, the cost in terms of testability, resource utilization and flexibility for scheduling and assignment of subsequent operations, is computed. Subsequently, a pair with the smallest cost is selected. The cost measures are described below. The algorithm for scheduling and assignment of operations is as follows.

--- schedule_and_assign()
1. while there exists a node which is not scheduled and assigned {
2.    $op_i$ = select_node();
3.    $\{(M_i, C_i)\}$ = set of (module, control step) pairs to/in which $op_i$ can be assigned/scheduled;
4.    compute cost($op_i, M_i, C_i$) = $\alpha$ * $cost_{Test}(op_i, M_i, C_i)$ + $\beta$ * $cost_{RU}(op_i, M_i, C_i)$ + $\gamma$ * $cost_{Flex}(op_i, M_i, C_i)$;
5.    select ($M_i, C_i$) with the minimum cost;
6.    assign inputs($op_i$) to scan registers/register files;
7.    update clique graph and data-path graph;
8.    update ASAP of all operations not yet scheduled;
9. }
10. assign all variables in register files to registers;

---

The object of associating a testability cost with a schedule and assignment for an operation is to measure the extent to which the schedule and assignment affects the testability of the data path, namely by forming loops in the data path. Since an assignment, can introduce three types of loops, an assignment loop, a false loop or a register file clique, a cost function is derived which comprises the costs associated with each type of loop formed, and the scan registers that may have to be expended to break the loops.

A measure of the testability cost is given by the following equation. The first component of the cost measure, ($size_{assign\_loop}$+$cost_{assign\_scan}$), is the cost due to formation of assignment loops, where $size_{assign\_loop}$ is the length of loops formed, and $cost_{assign\_scan}$ is the cost of using some existing or new scan registers to break the loops. The second and third components deal with the other two types of loops, false loop and register file clique, while $cost_{seq\_depth}$ measures the increase in sequential depth due to the assignment.

$$cost_{Test}=(size_{assign\_loop}+cost_{assign\_scan})+(size_{false\_loop}+cost_{floop\_scan})+(size_{clique}+cost_{clique\_scan})+cost_{seq\_depth}$$

Before describing how to compute the costs due to forming the loops, it is necessary to describe how to detect efficiently the formation of such loops during module assignment.

As module assignment progresses, a data path graph (DPG) is maintained, as indicated in the procedure schedule_and_assign(). Each node of the DPG represents a module. An edge ($M_i, M_j$) represents an interconnect from module $M_i$ to module $M_j$ in the data path, which is not broken by a scan register. When an operation $op_k$ is assigned to a module $M_j$, an edge is added from $M_i$ to $M_j$, for each module $M_i$ that has been assigned to operation $op_l$ $\epsilon$ fanin($op_k$), and the edge from $M_i$ to $M_j$ has not been broken by a scan register.

For an edge ($M_i, M_j$) to be added to the DPG, if there exists a path in the DPG from $M_j$ to $M_i$, a false loop will be introduced by assigning operation $op_k$ to module $M_j$. Consequently, while assigning $op_k$ to $M_j$, checking for paths from $M_j$ to each module $M_i$ that has been assigned to operation $op_l$ $\epsilon$ fanin($op_k$), suffices to detect any false loop that may be introduced by the assignment.

Let a CDFG edge ($op_i, op_j$) be termed a self-loop variable if both the operations $op_i$ and $op_j$ are assigned to the same module. The self-loop variables are associated with a register file (left or right) of a module. These variables are ultimately assigned to self-loop register(s) of the register file. If the lifetimes of the self-loop variables do not overlap, they are assigned to a single self-loop register. However, when the life, times overlap, they need to be assigned to multiple self-loop registers, leading to the formation of register file cliques in the S-graph.

FIG. 5a shows the variables that were assigned to the left register file of module A1, while assigning the operations of EWF shown in FIG. 6b. The variables ($op_i,op_j$), their lifetimes, the source module (module assigned to $op_i$), and the register assignment are shown in FIG. 5a. The self-loop variables (0,10), (1,7), (6,19) and (33,31) all exist in the 7th control step, and need to be assigned to four different self-loop registers. Since (PI,12) also exists in the 7th control step, another register is required. Assigning the rest of the variables as shown in FIG. 6b produces the left register file shown, with 5 self-loop registers in the left register file of module A1.

In order to detect formation of register file cliques during assignment, information of the lifetimes of the self-loop variables for each module $M_i$ is maintained. When an assignment is made, of operation $op_i$ to module $M_i$, the input variables of $op_i$ are checked for overlapping lifetimes with existing self-loop variables of $M_i$. A register file clique of size (m+k) will be formed, if a clique of size m existed for module $M_i$, and k input variables of operation $op_i$ have lifetimes overlapping with the existing self-loop variables of $M_i$.

The cost due to the formation of assignment loops is computed as follows. It is first checked whether assigning operation $op_i$ to module $M_j$ creates an assignment loop, by traversing the paths in the transitive fanin of operation $op_i$ in the CDFG. For each loop created an attempt is first made to break the loop using any available scan register. If successful, then $cost_{available\_scan}$ is added to the cost of scan registers, $cost_{assign\_scan}$, depending upon whether the used scan register could have been used by some other operation in the same control steps. If the loop cannot be broken by any available scan register, and adding a new scan register is allowable by the user-specified limit of Max_scan_regs_allowed, a new scan register is used to break the loop. The cost of a new scan register, $cost_{new\_scan}$, is added to $cost_{assign\_scan}$. If a loop is formed by assignment but is broken by using a scan register, then $size_{assign\_loop}$=0.

In the event that neither an available scan register can break the loop, nor a new scan register can be used, an assignment loop will be formed and left unbroken, in the data path. To discourage assigning the operation $op_i$ to module $M_j$ which leaves a loop in the data path, the size of the loop formed is added to the cost function. In the later case, no scan register is used, and $cost_{assign\_scan}=0$.

The computation of the cost associated with the assignment of $op_i$ to module $M_j$ is determined by the following algorithm.

```
cost_assignment_loop(op_i, M_j)
1.      size_assign_loop = cost_assign_scan = 0;
2.      if (assignment_loop_introduced(op_i, M_j))
3.          for each loop {
4.              if loop can be broken by available scan register
5.                  cost_assign_scan += cost_available_scan;
6.              else if (#available_scan_regs < Max_scan_regs_al-
                    lowed)
7.                  add new scan register to available scan
                    registers;
8.                  cost_assign_scan +=
                    cost_new_scan;
9.              }/* end if */
10.             else /* cannot use any new scan registers;
                allow loop to be formed */
11.             size_assign_loop += size of loop introduced;
12.         }/*end for */
```

The cost due to the formation of false loops and cliques is computed in a similar manner to that for assignment loops. The increase in sequential depth due to an assignment can be computed by traversing the transitive fanins of the operation being assigned.

The area overhead for synthesizing the testable design should be minimal, so that the method has a significant advantage over gate level design for testability schemes. The following are the criteria necessary to achieve high resource utilization. The most difficult operations for scheduling and assignment (the operations which are likely to require additional modules which may be underutilized) should be handled first, while the number of alternatives is still high. Special attention should be paid to interconnects. Introduction of interconnects which can not be easily reused later should be avoided. Strong preference is given to local interconnect over global interconnect. Registers are also an important part of the implementation cost. Any introduced register should have high likelihood to be effectively reused later.

There are two simple criteria which are used to predict whether an interconnect will be local or global after the physical synthesis of the design. The first criteria is that an interconnect from a unit to itself will remain local after placement and routing. The second criteria is based on the observation that the greatest difficulty in routing often arises due to high congestion in some areas of the chip. To avoid congestion, during the interconnect assignment and allocation phase, a limit is placed on the number of interconnects which originate from or go to a particular register file.

For a particular assignment and schedule choice for an operation, cost is assigned to the following resources which may be optionally used in an increasing order: 1) new register, (2) new local interconnect and (3) new global interconnect.

When more than one scheduling and assignment decision have the same hardware cost, preference is given to a decision which introduces a new resource with higher likelihood for later reuse. Chances for reusability of the introduced resource are calculated by counting how many unscheduled and nonassigned CDFG nodes can use the new resource.

The flexibility cost measures to what extent a particular schedule and assignment of an operation $op_i$ adversely affects the flexibility for scheduling and assignment of subsequent operations in the transitive fanout of $op_i$. The flexibility cost is calculated by summing up the reduction in slacks of the operations in the transitive fanout of $op_i$.

In order to elevate the effectiveness of the present technique, the following datapath-intensive circuits were chosen as benchmarks. The first example was an all-zero FIR wave digital filter (WDF). The second example was a 4th order cascade IIR filter. The final example is the popular 5th order elliptical wave digital filter (EWF). Its low pass version which was selected for implementation version was designed according to specification CCITT G712 PCM for use in the telecommunication industry. The example was simulated in bit-true mode, and verified that when 20 bits for word-length and 6 bits for coefficient are used it fully conforms to required specification of having passband ripple from 0 Hz to 3 KHz of +/−0.125 dB and stopband attenuation of −14 dB at 4.0 KHz and −32 dB at 4.6 Mhz. Although the required sampling frequency of 16 KHz can be easily achieved with complete hardware sharing, it was decided to schedule in critical path time of 17 control steps, assuming that adders take one control cycle and multipliers take two control cycles. The choice of time requirements for adder and multiplier was influenced by de facto standard benchmarking procedure described in high level synthesis literature.

Figure 7A:
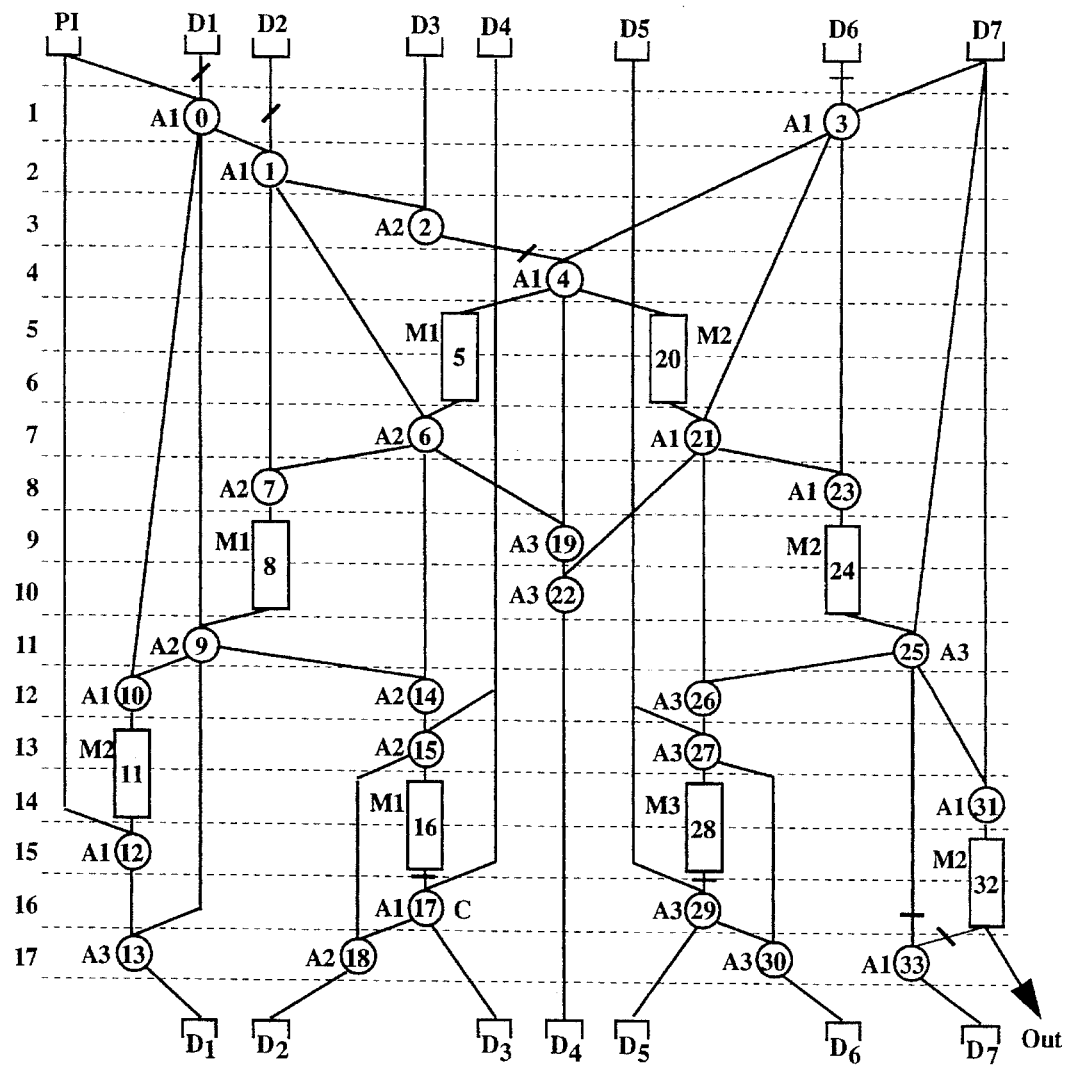
FIG. 7a is a scheduled and assigned control data flow graph of a 5th Order Wave Digital Elliptical Filter, synthesized for testability and resource utilization and scheduling performance constraints.
Figure 7B:
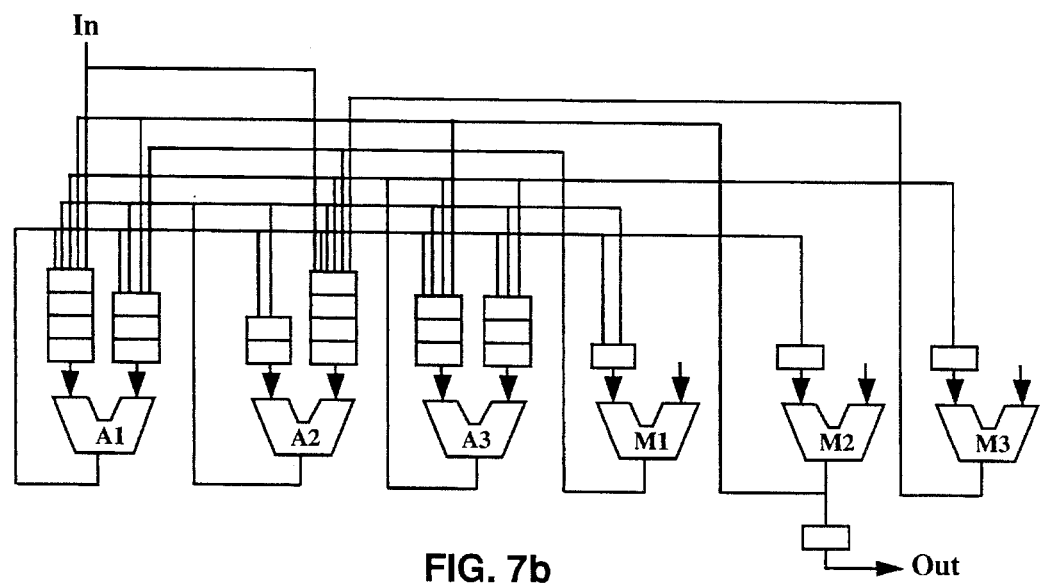

The schedule and assignment, of EWF and the corresponding data path synthesized using the Hyper system are shown in FIGS. 6a and 6b. The rectangles and the circles represent multiplication and addition operations, respectively. The detailed assignment of the register files of one of the modules, A1, is shown in FIG. 5b. The schedule and assignment, and the corresponding data path, obtained in accordance with the present invention are shown in FIGS. 7a and 7b. The eight scan variables selected to break the CDFG loop, are indicated by cut lines in FIG. 7a. The scan variables required only three scan registers, L1, R1 of module A1 (FIG. 5b), and R1 of module A2, shown in the data path in FIG. 7b. A subsequent scheduling and assignment phase uses the three scan registers to produce a minimal loop data path, as shown in FIG. 7b.

Table 1 shows the various parameters of the benchmark designs after high level synthesis.

TABLE 1

|  |  | CS | EXU | Reg | Mux | Interconnect |
|---|---|---|---|---|---|---|
| Wave digital filter | Initial | 5 | 2A,2M | 10 | 8 | 11 |
| (WDF) | Final | 5 | 2A,2M | 9 | 6 | 10 |
| IIR Filter | Initial | 6 | 2A,3M | 12 | 12 | 20 |
|  | Final | 6 | 2A,3M | 12 | 9 | 9 |
| Elliptical Wave | Initial | 17 | 3A,3M | 23 | 29 | 20 |
| Digital Filter | Final | 17 | 3A,3M | 24 | 32 | 27 |
| (EWF) |  |  |  |  |  |  |

For each of the three examples, there are two rows, corresponding to initial and final implementations. The initial designs were obtained by optimizing parameters other than testability, and the final version was produced by taking testability into account. The number of execution units (EXU) and control steps (CS) were the same in both the versions of the designs. In some cases, for example EWF, the final design needed a few more registers (Reg), multiplexers (Mux), and interconnects (Interconnect), indicating that testability improvement may result in a small increase in resource requirements. However, on the average, the area overhead was marginal. In order to evaluate the results of using the present invention, a timeframe expansion-based gate-level sequential ATPG was performed. In order to identify the testability of the circuits, the important ATPG parameters, fault coverage, test efficiency, test length, and ATPG time on a SUN Sparcstation 2 were compared. The initial designs did not use partial scan, whereas the final designs had some FFs selectively scanned. In order to make a comparison, a gate-level partial scan tool OPUS was applied on the initial circuit. OPUS is described in the article by V. Chickermane and J. H. Patel entitled "A Fault Oriented Partial Scan Design Approach" in Proc. of the Intl. Conf oil Computer-Aided Design, pp. 400–403, Nov. 1991.

registers during scheduling and assignment to avoid the formation of further loops in the data path. The proposed technique achieves high testability, without compromising resource utilization or performance for all the benchmark designs. Experimental results demonstrate the superiority of selecting partial scan registers during high level synthesis over partial scan selection at the gate level.

While there has been described and illustrated a preferred method and apparatus for hardware sharing in high level synthesis for partial scan testing optimization, it will be apparent to those skilled in the art that variations and modifications are possible without deviating from the broad

TABLE 2

| Circuit name | Circuit type | # of total FFs | # of scanned FFs | # of total faults | # of aborted faults | Fault cov. (%) | test eff. (%) | test len | ATPG CPU time (sec) |
|---|---|---|---|---|---|---|---|---|---|
| WDF.16 | init | 160 | 0 | 5798 | 289 | 91 | 95 | 63 | 74346.75 |
|  | GPS_c | 160 | 48 | 5798 | 2 | 96 | 100 | 93 | 525.5 |
|  | GPS_n | 160 | 16 | 5798 | 6 | 96 | 100 | 144 | 1515.1 |
|  | Final | 144 | 16 | 5534 | 3 | 96 | 100 | 126 | 754.7 |
| IIR. 16 | init | 192 | 0 | 7676 | 7709 | 0 | 3 | 0 | 20095.5 |
|  | GPS_c | 192 | 64 | 7976 | 3 | 97 | 100 | 168 | 820.32 |
|  | GPS_n | 192 | 16 | 7976 | 6762 | 12 | 15 | 92 | 17205.9 |
|  | Final | 192 | 16 | 6776 | 10 | 96 | 100 | 158 | 377.7 |
| EWF.8 | init | 184 | 0 | 3698 | 3515 | 2 | 5 | 8 | >36 h |
|  | GPS_c | 184 | 121 | 3698 | 0 | 97 | 100 | 131 | 38.3 |
|  | GPS_n | 184 | 24 | 3698 | 259 | 90 | 93 | 230 | 7166.8 |
|  | Final | 192 | 24 | 4108 | 5 | 97 | 100 | 184 | 649 |
| EWF.20 | init | 460 | 0 | 10364 | 10077 | 1 | 3 | 8 | >72 h |
|  | GPS_c | 460 | 300 | 10364 | 0 | 98 | 100 | 142 | 309.8 |
|  | GPS_n | 460 | 60 | 10364 | 6216 | 38 | 40 | 145 | 14894.5 |
|  | Final | 480 | 60 | 10916 | 16 | 98 | 100 | 260 | 233.2 |

Table 2 includes the results of running ATPG on the various versions of the circuit. The numerical suffix after the name in the first column corresponds to the wordsize of the implementation. There are four rows corresponding to each circuit. The rows marked init and final are the initial and final designs. The other two rows correspond to circuits obtained from the initial design by OPUS, run with two different options. The row GPS_c indicates the circuit obtained by OPUS after breaking all loops (except self-loops) using scan FFs. The row GPS_n indicates the circuit obtained when OPUS was constrained to use the same number of scan FFs as present in the final design.

Table 2 illustrates that the final designs obtained using the present invention were consistently more testable than the initial designs. In order to achieve the same level of testability, the gate-level tool OPUS needed to scan a significantly larger number of FFs (GPS_c) than required by the final designs (Final). For instance, in the case of EWF.20, OPUS needed 300 FFs to break all loops (except self-loops) and achieve the same, level of testability as the final design, which required only 60 scan FFs.

Moreover, when OPUS was restricted to scan the same number of FFs (GPS_n) as in the final design (Final), the testability achieved was significantly lower than that of the final design. In the case of EWF.20, while the final design achieved 100% test efficiency in only 233 seconds, GPS_n could only achieve 40% in 14894 seconds.

The present invention describes a method for exploiting hardware sharing in order to minimize the number of scan registers needed to synthesize a minimal-loop data path. Novel algorithms are used to select a minimal number of scan registers to break CDFG loops, and reuse the scan teachings and spirit of the present invention which shall be limited solely by the scope of the claims appended hereto.

What is claimed is:

1. A method of high level synthesis of an integrated circuit including execution units for partial scan testing from a control data flow graph (CDFG) description of the integrated circuit comprising the steps of:

allocating a quantity of execution units based upon resource allocation;

selecting scan variables assignable to scan registers for breaking all loops in said CDFG such that the number of scan registers is minimized, by calculating a loop cutting effectiveness (LCE) measure for estimating the quantity of loops broken by selecting a scan variable and by calculating a highest hardware sharing effectiveness (HSE) value for scan variables and selecting those scan variables with the highest calculated loop cutting effectiveness measure and hardware sharing effectiveness value;

scheduling and assigning operations to execution units for substantially minimal cost; and synthesizing the integrated circuit according to said allocating, said selecting and said scheduling and assigning.

2. A method as set forth in claim 1, wherein said scheduling and assigning operations step further comprises calculating a cost associated with the presence of any assignment loops, any false loops, and any register cliques formed during said scheduling and assigning operations step; and calculating a cost associated with an increase in sequential depth in the data path resulting from said scheduling and assigning operations step.

3. A method as set forth in claim 1, wherein said calculating a loop cutting effectiveness measure is performed using a random walk algorithm.

4. A method as set forth in claim 1, wherein said scheduling and assigning operations step further comprises calculating a cost associated with scheduling and assigning of an operation to an execution unit.

* * * * *